United States Patent
Hekmatshoar-Tabari et al.

(10) Patent No.: US 9,741,889 B2
(45) Date of Patent: Aug. 22, 2017

(54) CONTACT FOR SILICON HETEROJUNCTION SOLAR CELLS

(71) Applicant: INTERNATIONAL BUSINESS MACHINES CORPORATION, Armonk, NY (US)

(72) Inventors: Bahman Hekmatshoar-Tabari, White Plains, NY (US); Devendra K. Sadana, Pleasantville, NY (US); Ghavam G. Shahidi, Pound Ridge, NY (US); Davood Shahrjerdi, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 257 days.

(21) Appl. No.: 14/730,502

(22) Filed: Jun. 4, 2015

(65) Prior Publication Data
US 2015/0270424 A1    Sep. 24, 2015

Related U.S. Application Data

(60) Division of application No. 13/604,198, filed on Sep. 5, 2012, now Pat. No. 9,246,033, which is a (Continued)

(51) Int. Cl.
*H01L 31/036* (2006.01)
*H01L 31/0747* (2012.01)
(Continued)

(52) U.S. Cl.
CPC .......... *H01L 31/0747* (2013.01); *B82Y 20/00* (2013.01); *H01L 31/022441* (2013.01); (Continued)

(58) Field of Classification Search
CPC ......... H01L 31/0747; H01L 31/035236; H01L 31/022441; H01L 31/035254; H01L 31/0516; B82Y 20/00
(Continued)

(56) References Cited

U.S. PATENT DOCUMENTS 4,598,164 A * 7/1986 Tiedje .................... B82Y 20/00
                                              136/249
5,686,734 A   11/1997 Hamakawa et al.
(Continued)

FOREIGN PATENT DOCUMENTS

EP          0173556 A2    3/1986

OTHER PUBLICATIONS

Abeles, B. "Amorphous Semiconductor Compositionally Modulated Superlattices" Mat. Res. Soc. Symp. Proc. vol. 37. 1985. pp. 27-28.
(Continued)

*Primary Examiner* — Jayne Mershon
(74) *Attorney, Agent, or Firm* — Tutunjian & Bitetto, P.C.; Louis J. Percello

(57) ABSTRACT

A photovoltaic device and method include a substrate coupled to an emitter side structure on a first side of the substrate and a back side structure on a side opposite the first side of the substrate. The emitter side structure or the back side structure include layers alternating between wide band gap layers and narrow band gap layers to provide a multi-layer contact with an effectively increased band offset with the substrate and/or an effectively higher doping level over a single material contact. An emitter contact is coupled to the emitter side structure on a light collecting end portion of the device. A back contact is coupled to the back side structure opposite the light collecting end portion.

16 Claims, 5 Drawing Sheets

Related U.S. Application Data continuation of application No. 13/163,137, filed on Jun. 17, 2011, now abandoned.

(51) Int. Cl.
*H01L 31/0352* (2006.01)
*B82Y 20/00* (2011.01)
*H01L 31/0224* (2006.01)
*H01L 31/05* (2014.01)

(52) U.S. Cl.
CPC .......... *H01L 31/035236* (2013.01); *H01L 31/035254* (2013.01); *H01L 31/0516* (2013.01); *Y02E 10/50* (2013.01)

(58) Field of Classification Search
USPC .......................................................... 136/255
See application file for complete search history.

(56) References Cited

U.S. PATENT DOCUMENTS

| | | |
|---|---|---|
| 2008/0191195 A1 | 8/2008 | Tanizawa et al. |
| 2012/0211064 A1* | 8/2012 | Wagner .................. B82Y 20/00 136/255 |

OTHER PUBLICATIONS

Das, U., et al. "Surface Passivation and Heterojunction Cells on Si (100) and (111) Wafers Using DC and RF Plasma Deposited Si:H Thin Films" Applied Physics Letters 92, Nov. 2007. pp. 1-3.

Deki, H., et al. "Narrow-Bandgap A-Ge:H/A-Si:H Multilayers for Amorphous Silicon-Based Solar Cells" Solar Energy Material and Solar Cells 34. 1994. pp. 431-437.

Graeff, C., et al. "Electrically Detected Magnetic Resonance in A-Si:H/A-Ge:H Multilayers" Journal of Applied Physics, 79 (12), Jun. 1996. pp. 9166-9171.

Hirose, M., et al. "Quantum Wells and Superlattices" Journal of Non-Crystalline Solids 97&98. 1987. pp. 23-30.

Jensen, N., et al. "Optimization and Characterization of Amorphous/Crystalline Silicon Heterojunction Solar Cells" Progress in Photovoltaics: Research and Applications, vol. 10. Apr. 2001. pp. 1-13.

Kanevce, A., et al. "The Role of Amorphous Silicon and Tunneling in Heterojunction With Intrinsic Thin Layer (HIT) Solar Cells" Journal of Applied Physics, 105. Dec. 2008. pp. 1-7.

Kinoshita, T., et al. "High-Efficiency Hit Solar Cells for Excellent Power Generating Properties" Materials Research Society Symp. Proc., vol. 1123. 2009. (8 Pages).

Miyazaki, S., et al. "Optical and Electrical Properties of A-Si3N4:H/A-Si:H Superlattices Prepared by Plasma-Enhanced Nitridation Technique" Journal of Non-Crystalline Solids 137&138. 1991. pp. 1119-1122.

Miyazaki, S., et al. "Resonant Tunneling Through Amorphous Silicon-Silicon Nitride Double-Barrier Structures" Physical Review Letters, vol. 59, No. 1. Jul. 1987, pp. 125-127.

Nakano, S., et al. "High Performance A-Si Solar Cells and New Fabrication Methods for A-Si Solar Cells" Appled Physics A 41, May 1986. pp. 267-274.

Schmidt, M., et al. "Physical Aspects of A-Si:H/C-Si Hetero-Junction Solar Cells" Thin Solid Films 515, Jan. 2007. pp. 7475-7480.

Tiedje, T., et al. "Charge Transfer Doping in Amorphous Semiconductor Superlattices" Applied Physics Letters, 45 (2), Jul. 1984. pp. 179-181.

Tiedje, T., et al. "Recent Experimental Results on A-Si:H/A-Ge:H Superlattice Structures" Journal of Non-Crystalline Solids 77 & 78, 1985. pp. 1031-1040.

Varonides, A., et al. "A-Si:H (Alloy) P—I—N Superlattice Solar Cell Contacts" IEEE Transactions on Electron Devices, vol. 39, No. 10, Oct. 1992. pp. 2284-2289.

Wang, Q., et al. "Efficient Heterojunction Solar Cells on P-Type Crystal Silicon Wafers" Applied Physics Letters, 96. 2010. (3 Pages).

Yamashita, K., et al. "Modulation Doping in A-Si:H/A-Ge:H Multilayer Structures" Journal of Non-Crystalline Solids, 198-200, 1996. pp. 800-803.

* cited by examiner

CONTACT FOR SILICON HETEROJUNCTION SOLAR CELLS

RELATED APPLICATION DATA

This application is a Divisional application of co-pending U.S. patent application Ser. No. 13/604,198 filed on Sep. 5, 2012, which is a Continuation application of co-pending U.S. patent application Ser. No. 13/163,137 filed on Jun. 17, 2011, incorporated herein by reference in their entirety.

BACKGROUND

Technical Field

The present invention relates to photovoltaic devices, and more particularly to contact structures which improve performance of heterojunction cells.

Description of the Related Art

Heterojunction with intrinsic thin layer (HIT) solar cells have improved in efficiency (e.g., 23% efficiency in the laboratory and 21% efficiency in production). The HIT cells are comprised of intrinsic/doped hydrogenated amorphous silicon (a-Si:H) serving as front (emitter) and back contacts, on a crystalline silicon (c-Si) absorber with p-type or n-type doping. An advantage of HIT cells is the low deposition temperature of a-Si:H (~200° C.) which offers a lower thermal budget as compared to conventional c-Si cell processes (~1000° C.). The low process temperature also permits the use of low-cost Si wafers by preserving carrier lifetime.

Referring to FIG. 1, an energy band diagram of a conventional HIT cell 10 on a p-type crystalline silicon (c-Si) substrate 12 is shown in equilibrium. The equilibrium Fermi level is denoted by $E_F$, and the conduction band and valence band edges are denoted by $E_c$ and $E_v$, respectively. Open circuit voltage of the cell 10 is the difference of the quasi Fermi level for electrons at an emitter 14 (the equilibrium Fermi level in n$^+$ a-Si:H layer 16) and the quasi Fermi level for holes at a back contact 18 (the equilibrium Fermi level in p$^+$ a-Si:H layer 20). The emitter 14 includes a front contact 15. Intrinsic layer 22 is disposed between layer 16 and substrate 12.

The band offsets and equilibrium Fermi level parameters are the fundamental material properties of a-Si:H and may only vary marginally by changing the growth conditions. For high-quality a-Si:H, the measured values of $\Delta E_c$ and $\Delta E_c$ are in the range of 0.1-0.2 eV and 0.4-0.5 eV, respectively. The equilibrium Fermi level cannot move closer to the conduction band than 0.15-0.2 eV in n$^+$ a-Si:H 16, and cannot move closer than 0.4-0.45 eV to the valence band in p$^+$ a-Si:H 20 by increasing the doping concentration. This is because doping incorporation increases the defect density in a-Si:H and eventually pins the Fermi level position.

Replacing a-Si:H with other compounds results in creating larger band-offsets. Such band-offsets may improve the open circuit voltage, but at the cost of reducing fill factor (FF). This is because the tunneling rate of majority carriers is lower through the larger band-offsets. In addition, the issue of low doping efficiency applies to these compounds as well.

SUMMARY

A photovoltaic device and method include a substrate coupled to an emitter side structure on a first side of the substrate and a back side structure on a side opposite the first side of the substrate. The emitter side structure or the back side structure include layers alternating between wide band gap layers and narrow band gap layers to provide a multilayer contact with an effectively increased band offset with the substrate and/or an effectively higher doping level over a single material contact. An emitter contact is coupled to the emitter side structure on a light collecting end portion of the device. A back contact is coupled to the back side structure opposite the light collecting portion.

Another photovoltaic device includes a substrate coupled to an emitter side superlattice on a first side of the substrate and a back side superlattice on a side opposite the first side of the substrate. The emitter side superlattice and the back side superlattice both have a plurality of layers alternately including wide band gap layers and narrow band gap layers to provide a multilayer contact with an effectively increased band offset with the substrate, and/or effectively increased doping level over a single material contact. An emitter contact is coupled to the emitter side superlattice on a light collecting end portion of the device. A back contact is coupled to the back side superlattice opposite the light collecting portion.

A method for fabricating a photovoltaic device includes providing a substrate; forming a plurality of layers including alternating wide band gap and narrow band gap layers to form a superlattice to provide a multilayer with an effectively increased band offset with the substrate and/or effectively increased doping level over a single material contact; forming a conductive contact on the superlattice; and forming a contact structure on the substrate on a side opposite the superlattice.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
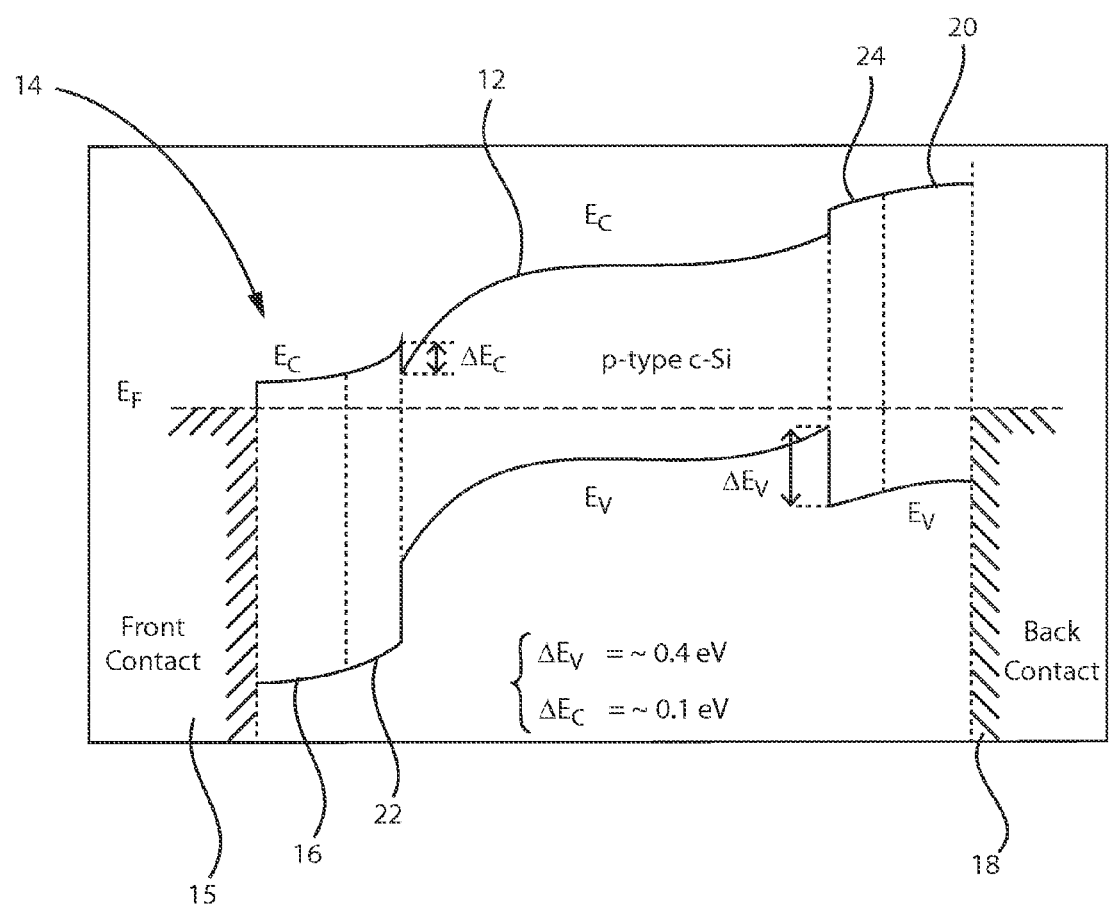
FIG. 1 is an energy band diagram of a conventional heterojunction with intrinsic thin layer (HIT) cell on a p-type crystalline silicon (c-Si) substrate.

In accordance with the present principles, superlattice contact structures and methods for forming the same are provided for heterojunction solar cells. The superlattice structure improves open circuit voltage of the cell without compromising fill factor (FF). The open-circuit voltage is improved due to a larger effective band-offset of the superlattice contact and/or modulation (transfer) doping of a low band gap material in the superlattice without pinning the Fermi level. For example, n-type doping may be enhanced by the transfer of electrons from the wide bandgap material to the narrow band gap material or the transfer of holes from the narrow bandgap material to the wide band gap material. Likewise, p-type doping may be enhanced by the transfer of holes from the wide bandgap material to the narrow band gap material or the transfer of electrons from the narrow bandgap material to the wide band gap material. The fill factor is not compromised by overall reduced thickness of wide band gap material and/or the creation of mini-bands due to quantum confinement in narrow band gap material. The narrow band gap material and the mini-band creation enhance the majority carrier tunneling through the superlattice.

It is to be understood that the present invention will be described in terms of a given illustrative architecture having a wafer or substrate; however, other architectures, structures, substrate materials and process features and steps may be varied within the scope of the present invention.

It will also be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Methods as described herein may be used in the fabrication of photovoltaic cells and chips or modules including the same. The resulting integrated chips or devices can be distributed by the fabricator in raw wafer form (that is, as a single wafer that has multiple unpackaged chips), as a bare die, or in a packaged form. In any case, the chip or device may be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figures 2, 3:
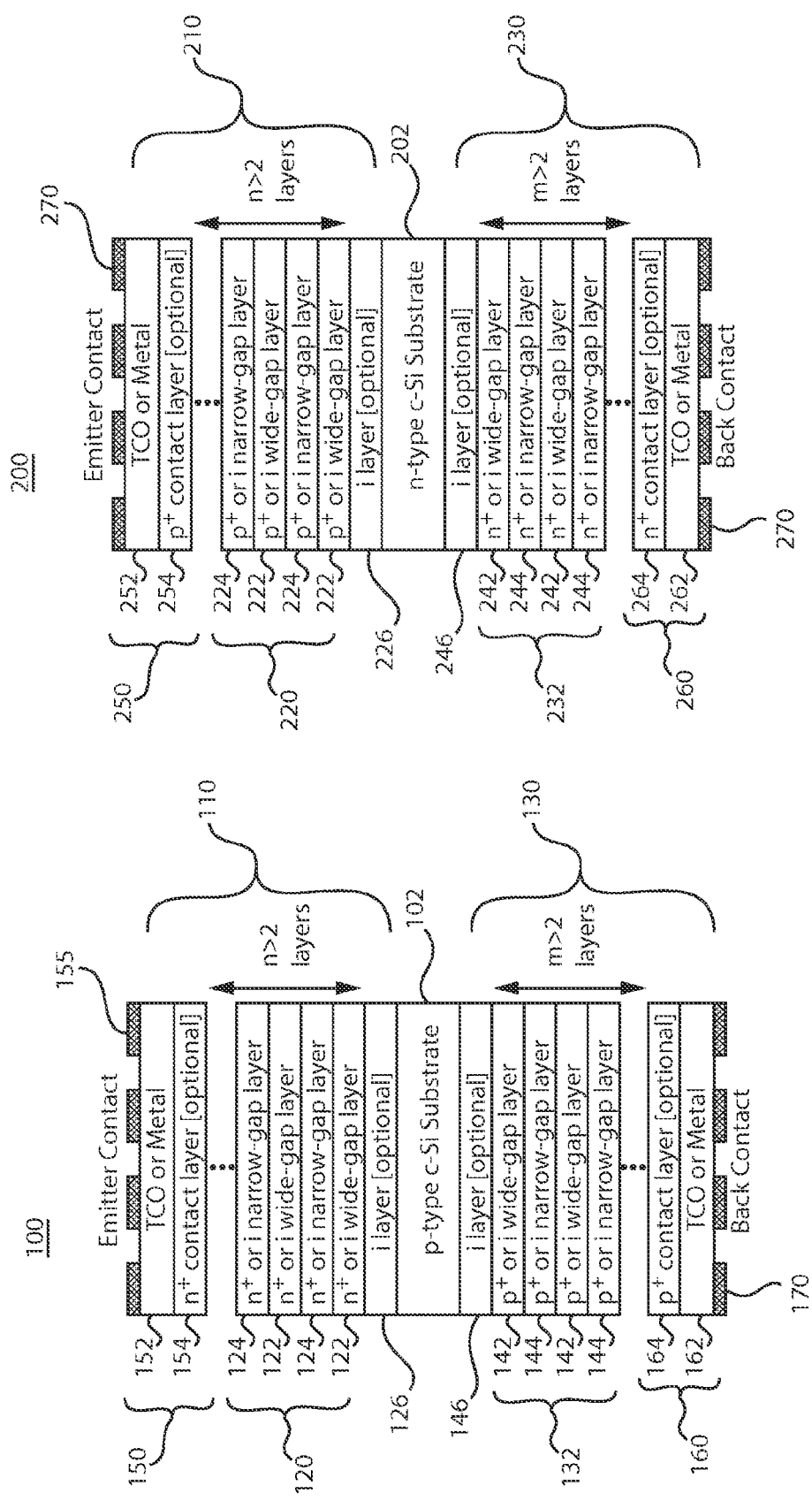
FIG. 2 is a cross-sectional view of a heterojunction solar cell with superlattices on front and back contacts (sides) on a p-type c-Si substrate in accordance with one embodiment.
FIG. 3 is a cross-sectional view of a heterojunction solar cell with superlattices on front and back contacts (sides) on an n-type c-Si substrate in accordance with another embodiment.

Referring now to the drawings in which like numerals represent the same or similar elements and initially to FIG. 2, an illustrative structure of a photovoltaic device 100 with a p-type substrate 102 is shown. The substrate 102 preferably includes silicon and may be single-crystalline (c-Si) or microcrystalline (μc-Si). The substrate 102 includes an emitter or front contact and a back contact. The word "contact" is employed to refer to the structure connected to the substrate 102, which may include an emitter/front contact or a back contact. Since these contacts also include conductive contacts as well, to prevent confusion, the contacts will be referred to as emitter side 110 and back side 130.

In accordance with the present principles, an emitter side 110 of the substrate 102 includes a superlattice stack of layers 120. The stack 120 of layers includes alternating wide band gap (high band gap or wide gap) layers 122 (e.g., doped layers) and narrow band gap (low band gap or narrow gap) layers 124 (e.g., intrinsic layers). The number of layers n is greater than 2. Wide gap layers 122 include a wide band gap semiconductor, which is a semiconductor material with an electronic band gap larger than one or two electronvolts (eV). The narrow gap layers 124 include semiconducting materials with a band gap that is comparatively small compared to silicon. Each wide-gap layer and narrow-gap layer may include a doped layer ($n^+$ dopants) or an undoped layer, or an intrinsic layer (i-layer). An optional intrinsic layer 126 may be interposed between the stack 120 and the substrate 102. In one embodiment, the superlattices 120, 132 include alternating doped and intrinsic layers.

Semiconducting material(s) forming passivation intrinsic layers or i-layer(s) may include a-Si:H, a-Ge:H, a-SiGe$_x$:H, a-SiN$_x$:H, a-SiO$_x$:H, a-SiC$_x$:H, or combinations of these materials. The semiconducting material(s) forming doped/undoped layer(s) may include amorphous, nanocrystalline, microcrystalline or polycrystalline films(s) of Si, Ge, SiGe$_x$, SiC$_x$, SiO$_x$, SiN$_x$, or combinations of these materials and may or may not contain hydrogen. The films forming the doped or undoped layers may or may not contain fluorine or deuterium. The doped layers may include appropriate n-type or p-type dopant materials. Examples of the high-bandgap/low-bandgap material combinations for the superlattice 120 include a-Si$_x$C$_{1-x}$:H/a-Si$_y$Ge$_{1-y}$:H, a-Si$_x$Ni$_{1-x}$:H/a-Si$_y$Ge$_{1-y}$:H, a-Si$_x$O$_{1-x}$:H/a-Si$_y$Ge$_{1-y}$:H, where $0 \leq x << 1$ and $0 \leq y \leq 1$. The thickness of the layers 122, 124 is preferably less than 20 nm and more preferably in the range of 1 nm-20 nm with the overall thickness of the emitter side 110 preferably being below ~15 nm (to reduce light absorption).

It should be understood that the present embodiments preferably employ doping techniques that inflict minimal damage to the doped layers. Doping of semiconductors is the process of locally manipulating their charge carrier density and conductivity. Conventional doping is usually achieved via the bombardment of semiconductors with dopants followed by thermal annealing (ion implantation). Bombardment of materials with energetic ions can create severe crystal damage, in particular, for nanoscale layers, thereby degrading the device performance.

In accordance with the present principles, a nondestructive doping method is preferably employed to dope the materials of the superlattice(s) 120 and 132. This employs charge exchange between two materials (e.g., a semiconductor material and a selected dopant material or doped material and an intrinsic material, etc.) at their interface, and is referred to as modulated or transfer doping. The process employs misalignment of the Fermi levels on each side to utilize the interfacial charge transfer as an effective doping scheme to control the conductivity of nano-structured materials. By selecting the stacking materials in the superlattice structures 120 and 132, transfer doping is employed to increase effective doping and conductivity (e.g., over conventional a-Si doped layers) since lattice damage is avoided.

The back side 130 of the substrate 102 includes a superlattice stack of layers 132. The stack of layers 132 includes alternating wide gap (high band gap) layers 142 and narrow gap (low band gap) layers 144. The number of layers m is greater than 2. Each wide gap layer and narrow gap layer may include a doped layer ($p^+$ dopants) or an undoped layer, or an intrinsic layer (i-layer). An optional intrinsic layer 146 may be interposed between the stack 132 and the substrate 102.

Semiconducting material(s) forming passivation intrinsic layers or i-layer(s) may include a-Si:H, a-Ge:H, a-SiGe$_x$:H, a-SiN$_x$:H, a-SiO$_x$:H, a-SiC$_x$:H, or combinations of these materials. The semiconducting material(s) forming doped/undoped layer(s) may include amorphous, nanocrystalline, microcrystalline or polycrystalline films(s) of Si, Ge, SiGe$_x$, SiC$_x$, SiO$_x$, SiN$_x$, or combinations of these materials and may or may not contain hydrogen. The films forming the doped or undoped layers may or may not contain fluorine or deuterium. The doped layers may include appropriate n-type or p-type materials. Examples of the high band gap/low band gap material combinations for the superlattice 132 include a-Si$_x$C$_{1-x}$:H/a-Si$_y$Ge$_{1-y}$:H, a-Si$_x$Ni$_{1-x}$:H/a-Si$_y$Ge$_{1-y}$:H, a-Si$_x$O$_{1-x}$:H/a-Si$_y$Ge$_{1-y}$:H, where $0 \leq x << 1$ and $0 \leq y \leq 1$. The thickness of the layers 142, 144 is preferably less about 20 nm and more preferably in the range of 1 nm-20 nm with the overall thickness of the back side 130 being below ~50 nm.

An emitter top portion 150 may include a conductive layer 152 and an optional contact layer (n$^+$) 154. The contact layer 154 may connect with the emitter side 110 stack 120. The contact layer 154 may include amorphous, nanocrystalline, microcrystalline or polycrystalline films(s) of Si, Ge, SiGe$_x$, SiC$_x$, SiO$_x$, SiN$_x$, or combinations of these materials and may or may not contain hydrogen and may or may not contain fluorine or deuterium. The conductive layer 152 may include a metal such as Aluminum, Silver, Tungsten, etc. and/or conductive layer 152 may include a transparent conductive oxide, such as indium tin oxide, zinc oxide, etc. Other structures may also be included such as conductive fingers 155, anti-reflection coatings, protective coatings, etc.

A back portion 160 may include a conductive layer 162 and an optional contact layer (pt) 164. The contact layer 164 may connect with the back side 130 stack 132. The contact layer 164 may include amorphous, nanocrystalline, microcrystalline or polycrystalline films(s) of Si, Ge, SiGe$_x$, SiC$_x$, SiO$_x$, SiN$_x$, or combinations of these materials and may or may not contain hydrogen and may or may not contain fluorine or deuterium. The conductive layer 162 may include a metal such as Aluminum, Silver, Tungsten, etc., and/or conductive layer 162 may include a transparent conductive oxide, such as Indium Tin Oxide, Zinc Oxide, etc. Other structures may be included as well. For example, antireflection coatings may be formed or conductive fingers 155, 170 may be employed.

At least one of layers 152 and 162 is composed of a transparent conductive material to permit light to enter the absorption layer 102. If both layers 152 and 162 are composed of transparent conductive materials, the light can enter from both sides of the cell, and the cell is referred to as a bifacial cell. If layer 152 (or 162) is composed of a transparent conductive material, metal fingers 155 (or 170) are needed to allow for low electrical contact resistance, while if layer 152 (or 162) is composed of a metal, the electrical conductivity of the contact is sufficient and the metal fingers 155 (or 170) are not needed. The metal used for layer 152 or 162 may have reflective properties.

Referring to FIG. 3, an illustrative structure of another photovoltaic device 200 with an n-type substrate 202 is shown. The substrate 202 preferably includes silicon and may be single-crystalline (c-Si) or microcrystalline (μc-Si). In accordance with the present principles, an emitter side 210 of the substrate 202 includes a superlattice stack 220 of layers. The stack 220 of layers includes alternating wide gap (high band gap) layers 222 and narrow gap (low band gap) layers 224. The number of layers n>2. Wide-gap layers 222 include a wide band gap semiconductor, which is a semiconductor material with an electronic band gap larger than one or two electronvolts (eV). The narrow gap layers 224 include semiconducting materials with a band gap that is comparatively small compared to silicon. Each wide gap layer and narrow gap layer may include a doped layer (p$^+$ dopants), an undoped layer or an intrinsic layer (i-layer). An optional intrinsic layer 226 may be interposed between the stack 220 and the substrate 202. In one embodiment, the superlattices 220, 232 include alternating doped and intrinsic layers.

Semiconducting material(s) forming passivation intrinsic layers or i-layer(s) may include a-Si:H, a-Ge:H, a-SiGe$_x$:H, a-SiN$_x$:H, a-SiO$_x$:H, a-SiC$_x$:H, or combinations of these materials. The semiconducting material(s) forming doped/undoped layer(s) may include amorphous, nanocrystalline, microcrystalline or polycrystalline films(s) of Si, Ge, SiGe$_x$, SiC$_x$, SiO$_x$, SiN$_x$, or combinations of these materials and may or may not contain hydrogen. The films forming the doped or undoped layers may or may not contain fluorine or deuterium. Examples of the high band gap/low band gap material combinations for the superlattice include a-Si$_x$C$_{1-x}$:H/a-Si$_y$Ge$_{1-y}$:H, a-Si$_x$Ni$_{1-x}$:H/a-Si$_y$Ge$_{1-y}$:H, a-Si$_x$O$_{1-x}$:H/a-Si$_y$Ge$_{1-y}$:H, where $0 \leq x << 1$ and $0 \leq y \leq 1$. The thickness of the layers 222, 224 is preferably less than 20 nm and more preferably in the range of 1 nm-20 nm with the overall thickness of the emitter side 210 preferably being below ~15 nm (to reduce light absorption in the contact). Doping is preferably performed using a non-destructive technique (e.g., doping during layer growth, modulated or transfer doping, etc.).

The back side 230 of the substrate 202 includes a superlattice stack 232 of layers. The stack of layers 232 includes alternating wide gap (high band gap) layers 242 and narrow gap (low band gap) layers 244. The number of layers m>2. Each wide gap layer and narrow gap layer may include a doped layer (n$^+$ dopants) or an undoped layer, or an intrinsic layer (i-layer). An optional intrinsic layer 246 may be interposed between the stack 232 and the substrate 202.

Semiconducting material(s) forming passivation intrinsic layers or i-layer(s) may include a-Si:H, a-Ge:H, a-SiGe$_x$:H, a-SiN$_x$:H, a-SiO$_x$:H, a-SiC$_x$:H, or combinations of these materials. The semiconducting material(s) forming doped/undoped layer(s) may include amorphous, nanocrystalline, microcrystalline or polycrystalline films(s) of Si, Ge, SiGe$_x$, SiC$_x$, SiO$_x$, SiN$_x$, or combinations of these materials and may or may not contain hydrogen. The films forming the doped or undoped layers may or may not contain fluorine or deuterium. Examples of the high band gap/low band gap material combinations for the superlattice include a-Si$_x$C$_{1-x}$:H/a-Si$_y$Ge$_{1-y}$:H, a-Si$_x$Ni$_{1-x}$:H/a-Si$_y$Ge$_{1-y}$:H, a-Si$_x$O$_{1-x}$:H/a-Si$_y$Ge$_{1-y}$:H, where $0 \leq x << 1$ and $0 \leq y \leq 1$. The thickness of the layers 242, 244 is preferably in the range of 1 nm-20 nm with the overall thickness of the back side 230 being below ~50 nm.

An emitter top portion 250 may include a conductive layer 252 and an optional doped contact layer (p$^+$) 254. The contact layer 254 may connect with the emitter side 210 stack 220. The contact layer 254 may include amorphous, nanocrystalline, microcrystalline or polycrystalline films(s) of Si, Ge, SiGe$_x$, SiC$_x$, SiO$_x$, SiN$_x$, or combinations of these materials and may or may not contain hydrogen and may or may not contain fluorine or deuterium. The conductive layer 252 may include a metal such as Aluminum, Silver, Tungsten, etc., and/or conductive layer 252 may include a transparent conductive oxide, such as Indium Tin Oxide, Zinc Oxide, etc.

A back portion 260 may include a conductive layer 262 and an optional contact layer (n$^+$) 264. The contact layer 264 may connect with the back side 230 stack 232. The contact layer 264 may include amorphous, nanocrystalline, microcrystalline or polycrystalline films(s) of Si, Ge, SiGe$_x$, SiC$_x$, SiO$_x$, SiN$_x$, or combinations of these materials and may or may not contain hydrogen and may or may not contain fluorine or deuterium. The conductive layer 262 may include a metal such as Aluminum, Silver, Tungsten, etc., and/or conductive layer 162 may include a transparent conductive oxide, such as Indium Tin Oxide, Zinc Oxide, etc. Other structures may be included as well. For example, antireflection coatings may be formed or conductive fingers 270 may be employed. At least one of the layers 252 and 262 is composed of a transparent conductive material to allow the light to enter the absorption layer 202. If both layers 252 and 262 are composed of transparent conductive materials, the light can enter from both sides of the cell (a bifacial cell). If layer 252 (or 262) is composed of a transparent conductive material, metal fingers 270 are needed on that respective side to allow for low electrical contact resistance, while if layer 252 (or 262) is composed of a metal, the electrical conductivity of the contact is sufficient and the metal fingers 255 (or 270) are not needed. The metal type used for layer 252 or 262 is preferably reflective.

Figure 4:
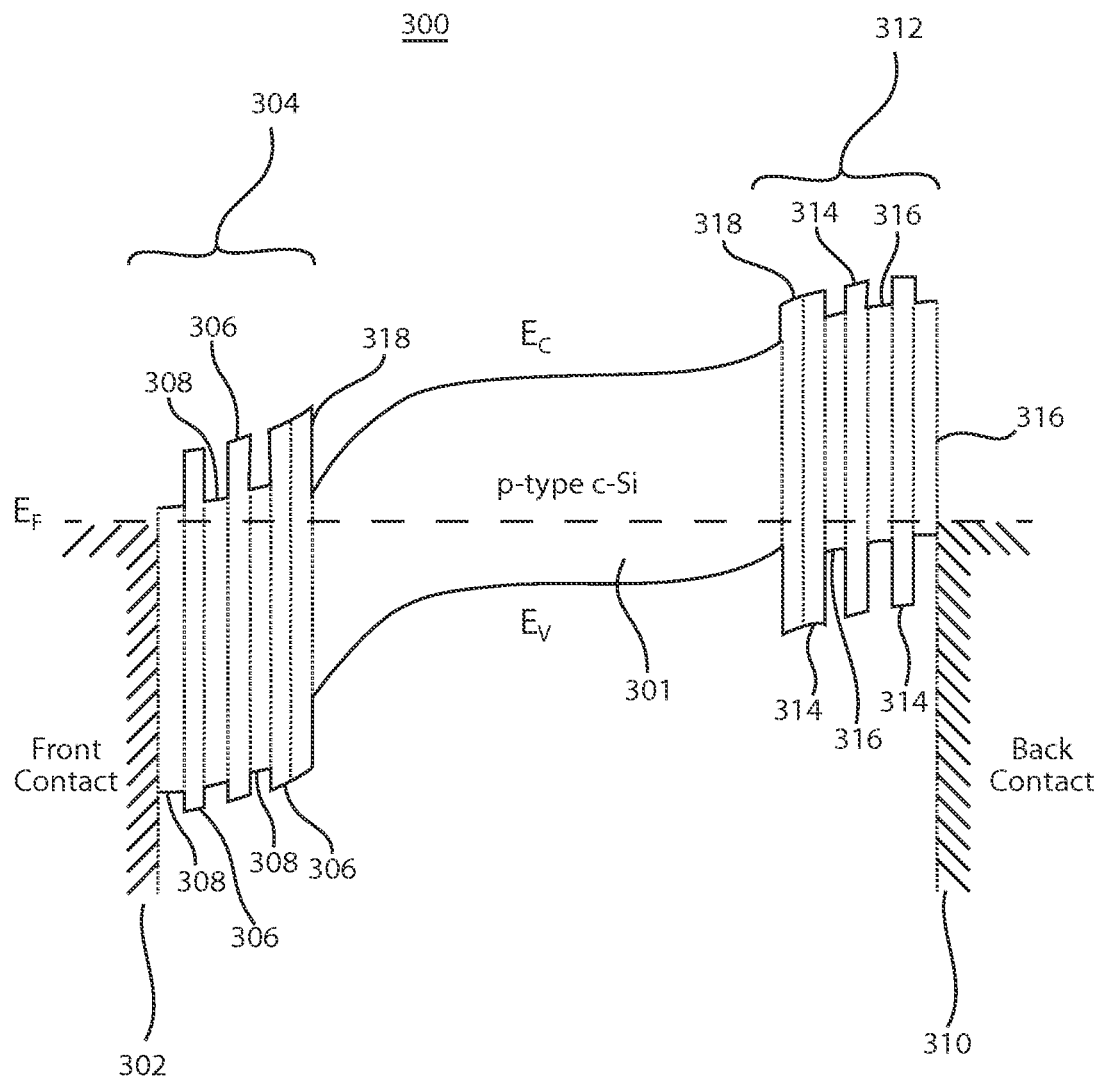
FIG. 4 is an energy band diagram of a heterojunction solar cell on a p-type crystalline silicon (c-Si) substrate with a-Si$_x$C$_{1-x}$:H/a-Si$_y$Ge$_{1-y}$:H front and a-Si$_x$Ni$_{1-x}$:H/a-Si$_y$Ge$_{1-y}$:H back superlattice contacts in accordance with one embodiment.

Referring to FIG. 4, a schematic energy band diagram of a p-type cell 300 with superlattice contacts (304, 312) coupled to a p-type silicon (c-Si) substrate 301 is illustratively shown. An emitter or front contact 302 is a conductive material. An emitter side stack 304 includes a plurality of alternating layers 306, 308 as described with respect to FIG. 2. In this example, the layers 306 include a-Si$_x$C$_{1-x}$:H, and layers 308 include a-Si$_y$Ge$_{1-y}$:H. A back contact 310 includes a conductive material. A back side stack 312 includes a plurality of alternating layers 314, 316 as described with respect to FIG. 2. In this example, the layers 314 include a-Si$_x$Ni$_{1-x}$:H, and layers 316 include a-Si$_y$Ge$_{1-y}$:H. Optional intrinsic layers 318 are included in this example.

As a result of the superlattice stacks 304 and 312, open circuit voltage is increased, without compromising the fill factor. To increase the open circuit voltage, the conduction band offset ($\Delta E_c$) is increased in the emitter 304 and/or the valence band offset ($\Delta E_v$) is increased in the back 312, and/or the doping efficiency of the stacked layers 306/308 and 314/316 is effectively increased to raise the quasi Fermi level position at the emitter 304 and/or increase the doping efficiency to lower the quasi Fermi level position in the back 312.

At least one of the band offsets is preferably increased. For example, the conduction band offset ($\Delta E_c$) is increased on the emitter side stack 304, and/or the valence band offset ($\Delta E_v$) is increased on the back side stack 312. This increases the separation of the quasi-Fermi levels for electrons and holes, and as a result, improves the open circuit voltage. The enhanced tunneling through the superlattice contacts permits a high fill factor which could otherwise be compromised if the increased band-offset were created by a single semiconductor contact material. The enhanced tunneling is due to the creation of mini-bands as a result of quantum confinement in the superlattice, and/or due to the enhanced electric field resulting from the improved doping of the narrow gap material by transfer (modulation) doping of the narrow gap material. The improved doping also further improves the open-circuit voltage of the cell by improving the electric field at the front and/or back junctions further increasing the separation of the quasi-Fermi levels.

Unlike conventional substitutional doping which requires the incorporation of impurity atoms in the lattice of an amorphous material resulting in the creation of extra defects and the degradation of doping efficiency, transfer (modulation) doping in accordance with the present principles does not involve the incorporation of impurity atoms, and as a result, the issue of Fermi level pinning is substantially suppressed. The equilibrium Fermi level can thus move closer to the conduction band on the n$^+$ contact side and closer to the valence band on the p$^+$ contact side.

Figures 5, 6:
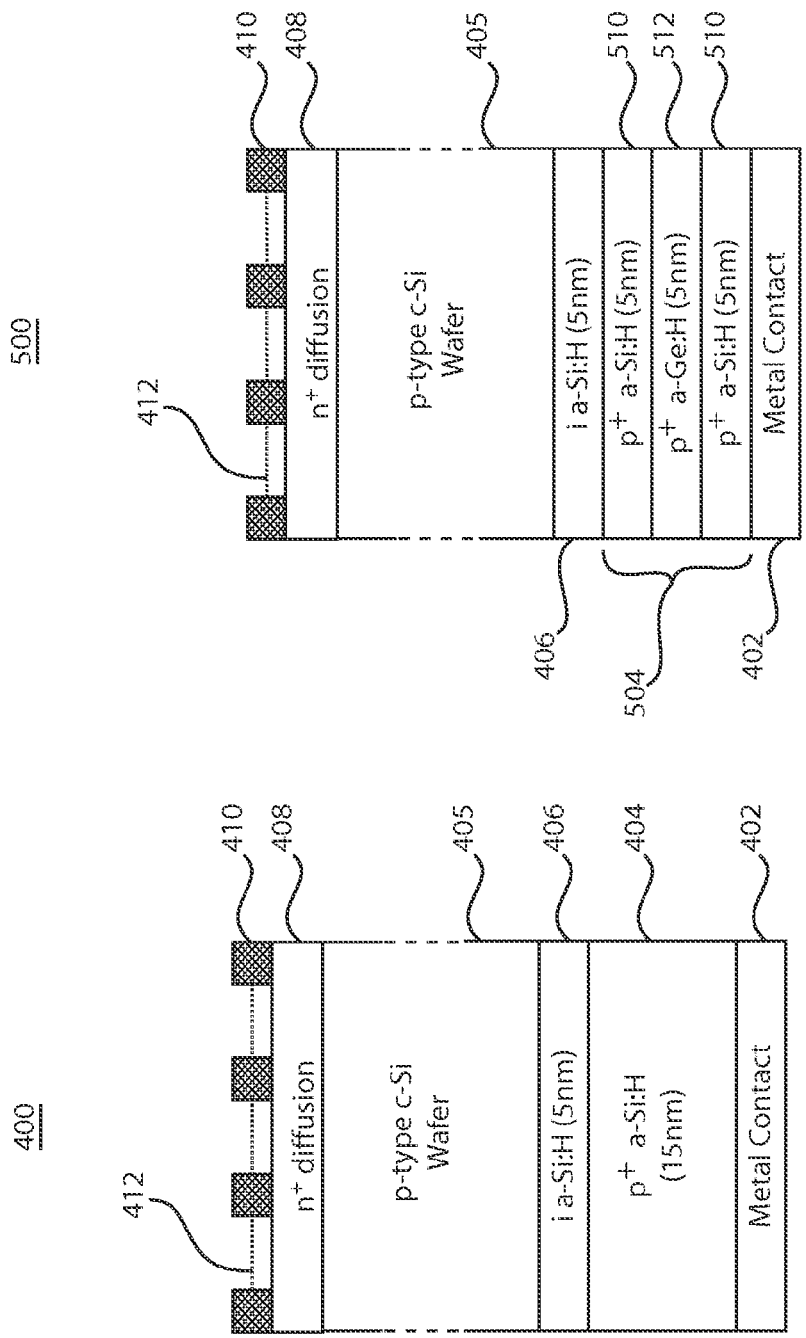
FIG. 5 is a cross-sectional view of a solar cell device with a conventional heterojunction back contact and a conventional diffused emitter (front) contact.
FIG. 6 is a cross-sectional view of a solar cell device with a superlattice heterojunction back contact and a conventional diffused emitter contact in accordance with one embodiment.

Referring to FIG. 5, a solar cell device 400 with a conventional diffused emitter (front) contact, and a conventional heterojunction back contact is shown. The cell 400 includes a metal back contact 402 and a p$^+$ a-Si:H (15 nm) back side doped layer 404. An intrinsic layer (5 nm) 406 is disposed between layer 404 and a p-type substrate 405 (e.g., c-Si). An emitter side includes an n$^+$ diffusion layer 408 and conductive fingers 410. An antireflection coating (ARC) 412 is also employed. In operation, this structure 400 provided an open circuit voltage ($V_{oc}$) of about 640 mV and a fill factor of about 72%. Switching the layer 404 to p$^+$ a-Ge:H of the same thickness reduced the $V_{oc}$ to about 580 mV and provided a fill factor (FF) of about 76%.

Referring to FIG. 6, a heterojunction cell 500 is shown in accordance with the present principles. The cell 500 includes back contact 402 but includes an alternating stack 504 for the back side. The stack 504 includes p$^+$ a-Si:H (5 nm) layers 510 which sandwich a layer 512 of a-Ge:H (5 nm). In operation, this structure 500 provides a $V_{oc}$ of about 665 mV and a fill factor (FF) of about 80%. Other improvements of $V_{oc}$ and FF may also be obtained by material selection and structures in accordance with the present principles.

The layers of stack 504 provide a combination of lower tunneling barrier and higher doping efficiency, which results in higher $V_{oc}$ and fill factor. It should be understood that the superlattice structures in accordance with the present principles may be provided for both front and back contacts. However, the devices using one superlattice on one side of the substrate and a conventional contact structure on the other side are also within the scope of the present principles (see, e.g., FIG. 6).

Figure 7:
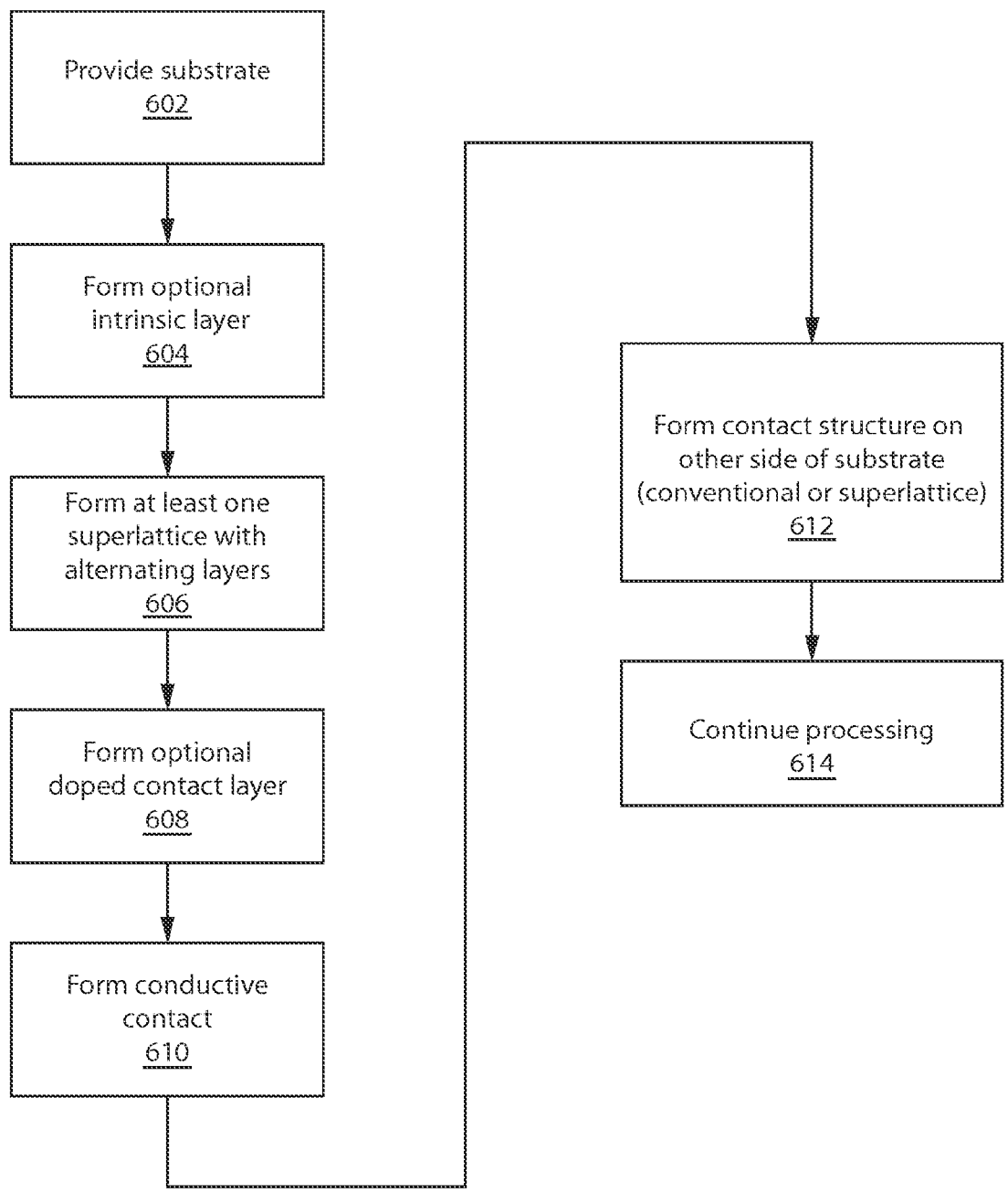
FIG. 7 is a block/flow diagram of a method for fabricating the heterojunction solar cell device in accordance with the present principles.

Referring to FIG. 7, a method for fabricating a photovoltaic device is illustratively shown. The flowchart/block diagram of FIG. 7 illustrates the architecture, functionality, and operation of possible implementations according to various embodiments of the present invention. In this regard, the functions noted in the block diagram may occur out of the order noted in the figure. For example, two blocks shown in succession may, in fact, be executed substantially concurrently, or the blocks may sometimes be executed in the reverse order, depending upon the functionality involved.

In block 602, a substrate or wafer is provided. The substrate may include a p-type or n-type substrate. A p-type substrate may include n-type doped layers on an emitter side and/or p-type doped layers on a back side. An n-type substrate may include p-type doped layers on an emitter side and/or n-type doped layers on a back side. The substrate preferably includes a single crystal or crystalline silicon (c-Si), although other substrate materials may be employed. In block 604, an optional intrinsic layer may be formed on one or both sides of the substrate.

In block 606, a superlattice is formed on at least one side of the substrate (or on an intrinsic layer if present). The superlattice includes a plurality of layers alternating between wide band gap and narrow band gap materials. The electrical effect of the superlattice is equivalent to that of a single layer semiconductor material with a higher conduction or valence band offset with the substrate as compared to between a-Si:H and the substrate, and/or is equivalent to a higher doping efficiency compared to that of a-Si:H. For example, on the emitter side, a conduction band offset may be effectively increased, and on the back side a valence band offset may be effectively increased. The superlattice layers may be formed using different techniques that depend on the type of materials and the desired properties. In useful embodiments, chemical vapor deposition (CVD), plasma enhanced CVD (PECVD) or other methods may be employed. The layers preferably include a thickness of less than about 20 nm to increase doping efficiency for those layers that include dopants. Higher tunneling current is achieved in this way due to quantum confinement by forming mini-bands (sub-bands), and/or due to electric field enhancement at the junctions resulting from improved doping efficiency with the plurality of layers of the superlattice.

In one example, for a crystalline silicon substrate, the wide band gap layers may include one of amorphous silicon carbide and amorphous silicon nitride and the narrow band gap layers may include one of amorphous silicon germanium and nano- or micro crystalline silicon. Higher conductivity is achieved by leveraging transfer doping between adjacent layers in the plurality of layers of the superlattice.

In block 608, a doped contact layer may optionally be formed between the superlattice and conductive contact. In block 610, a conductive contact is formed on the superlattice (or optional doped contact layer). The conductive contact may include a metal or transparent conductive material such as a transparent conductive oxide.

In block 612, a contact structure is formed on the substrate on a side opposite the superlattice. This may include a conventional contact structure or another superlattice. The superlattice formed includes the same structure as described above with respect to block 606 except any doped layer would include an opposite polarity with respect to the superlattice on the opposite side of the substrate. A conductive contact is also formed on the end of the superlattice. Also, an optional intrinsic layer and doped contact layer may optionally be formed. In block 614, continued processing occurs. This may include the formation of antireflection coatings, conductive fingers, protective layers, etc.

Having described preferred embodiments for improved contact for silicon heterojunction solar cells (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A photovoltaic device, comprising:
    a substrate coupled to an emitter side structure on a first side of the substrate and a back side structure on a side opposite the first side of the substrate;
    an emitter side structure comprising an $n^+$ diffusion layer;
    a back side structure engaged to the emitter side structure, the back side structure including a plurality of layers alternately including wide band gap layers and narrow band gap layers to provide a multilayer contact with at least one of an effectively increased band offset with the substrate and/or an effectively higher doping level over a single material contact;
    an emitter contact coupled to the emitter side structure on a light collecting end portion of the device; and
    a back contact coupled to the back side structure opposite the light collecting end portion.

2. The photovoltaic device as recited in claim 1, wherein the back side structure including doped layers and intrinsic layers.

3. The photovoltaic device as recited in claim 1, wherein the substrate includes a p-type substrate or an n-type substrate.

4. The photovoltaic device as recited in claim 1, wherein the substrate includes crystalline silicon and the wide band gap layers include one of amorphous silicon, amorphous silicon carbide and amorphous silicon nitride.

5. The photovoltaic device as recited in claim 1, wherein the substrate includes crystalline silicon and the narrow band gap layers include one of amorphous silicon, amorphous germanium, amorphous silicon germanium and nano- or micro crystalline silicon.

6. The photovoltaic device as recited in claim 1, further comprising an intrinsic layer disposed between the substrate and the at least one of the emitter side structure and the back side structure.

7. The photovoltaic device as recited in claim 1, further comprising a contact layer disposed between the back contact and the back side structure.

8. The photovoltaic device as recited in claim 1, wherein the wide band gap layers and the narrow band gap layers each have a thickness of less than about 20 nm.

9. A photovoltaic device, comprising:
    a substrate coupled to an emitter side $n^+$ diffusion layer on a first side of the substrate and a back side superlattice on a side opposite the first side of the substrate;
    the back side superlattice both having a plurality of layers alternately including wide band gap layers and narrow band gap layers to provide a multilayer contact with an effectively increased band offset with the substrate, and/or effectively increased doping level over a single material contact;
    an emitter contact coupled to the emitter side $n^+$ diffusion layer on a light collecting end portion of the device; and
    a back contact coupled to the back side superlattice opposite the light collecting end portion.

10. The photovoltaic device as recited in claim 9, wherein the back side superlattice each include doped layers and intrinsic layers.

11. The photovoltaic device as recited in claim 9, wherein the substrate includes a p-type substrate or an n-type substrate.

12. The photovoltaic device as recited in claim 9, wherein the substrate includes crystalline silicon and the wide band gap layers include one of amorphous silicon, amorphous silicon carbide and amorphous silicon nitride.

13. The photovoltaic device as recited in claim 9, wherein the substrate includes crystalline silicon and the narrow band gap layers include one of amorphous silicon, amorphous germanium, amorphous silicon germanium and nano- or micro crystalline silicon.

14. The photovoltaic device as recited in claim 9, further comprising an intrinsic layer disposed between the substrate and the back side superlattice.

15. The photovoltaic device as recited in claim 9, further comprising a contact layer disposed between the back contact and the back side superlattice.

16. The photovoltaic device as recited in claim 9, wherein the wide band gap layers and the narrow band gap layers each have a thickness of less than about 20 nm.

* * * * *